(12) United States Patent
Borleske et al.

(10) Patent No.: US 8,791,833 B2
(45) Date of Patent: Jul. 29, 2014

(54) HOUSINGS FOR AUTOMATIC METER READING DEVICES

(75) Inventors: Andrew J. Borleske, Garner, NC (US);
Rodney C. Hemminger, Raleigh, NC (US); Robert T. Mason, Jr., Raleigh, NC (US); Robert S. Fuller, West Bend, WI (US)

(73) Assignee: Elster Electricity, LLC, Raleigh, NC (US)

( * ) Notice: Subject to any disclaimer, the term of this patent is extended or adjusted under 35 U.S.C. 154(b) by 2018 days.

(21) Appl. No.: 11/410,434

(22) Filed: Apr. 24, 2006

(65) Prior Publication Data
US 2006/0245148 A1 Nov. 2, 2006

Related U.S. Application Data

(60) Provisional application No. 60/674,953, filed on Apr. 25, 2005.

(51) Int. Cl.
*G08C 19/16* (2006.01)
*G08B 23/00* (2006.01)

(52) U.S. Cl.
USPC ............. 340/870.02; 340/870.01; 361/600; 361/664

(58) Field of Classification Search
USPC ............. 340/870.01, 870.02; 361/600, 664
See application file for complete search history.

(56) References Cited

U.S. PATENT DOCUMENTS

| | | | | |
|---|---|---|---|---|
| 4,080,570 | A * | 3/1978 | Pearson | 324/156 |
| 4,404,521 | A * | 9/1983 | Fennell | 324/110 |
| 4,796,844 | A * | 1/1989 | Barker | 248/222.51 |
| 5,777,222 | A * | 7/1998 | Roberts | 73/273 |
| 6,421,230 | B1 * | 7/2002 | Matthews | 361/655 |
| 6,498,717 | B2 * | 12/2002 | Matthews | 361/665 |
| 6,516,966 | B1 * | 2/2003 | Leonard | 220/480 |
| 6,663,422 | B1 * | 12/2003 | Robinson et al. | 439/517 |
| 6,958,447 | B1 * | 10/2005 | Thornton et al. | 174/58 |
| 2003/0184956 | A1 * | 10/2003 | Robinson et al. | 361/659 |
| 2004/0093917 | A1 * | 5/2004 | Sullivan et al. | 70/164 |
| 2005/0178174 | A1 * | 8/2005 | Ely et al. | 70/164 |

* cited by examiner

*Primary Examiner* — Hai Phan
*Assistant Examiner* — Amine Benlagsir
(74) *Attorney, Agent, or Firm* — Baker & Hostetler LLP

(57) ABSTRACT

Preferred embodiments of housings for an automatic meter reading device permit the automatic meter reading device to be mounted on a meter such as a water meter, or on a wall remote from the meter. A removable portion of the housing can be separated from a body of the housing when the housing is used to mount the automatic meter reading device on the meter.

24 Claims, 7 Drawing Sheets

HOUSINGS FOR AUTOMATIC METER READING DEVICES

CROSS-REFERENCE TO RELATED APPLICATIONS

This application claims priority under 35 U.S.C. §119(e) to U.S. provisional application No. 60/674,953, filed Apr. 25, 2005, the contents of which is incorporated by reference herein in its entirety.

FIELD OF THE INVENTION

The present invention relates generally to meters for measuring consumption of water, gas, electrically, etc. More particularly, the invention relates to devices and methods for mounting automatic meter reading devices used in connection with such meters.

BACKGROUND OF THE INVENTION

Water meters used to measure water consumption are often mounted in a water pit. Information can be relayed to and from a water-pit-mounted water meter by radio frequency telemetry, using an automatic meter reading (AMR) device.

FIG. 7 depicts a water meter 106 and an AMR device 104 mounted in a water pit 107. The AMR device 104 can be suspended from the underside of a lid 105 used to cover the water pit 107, by a suitable means such as a retaining cap 109. The lid 105 usually has a hole formed therein that permits an antenna 128 of the AMR device 104 to extend through the lid 105. It is believed that maximum signal transmission and reception for the antenna 128 is achieved when the antenna 128 is oriented in approximately the manner depicted in FIG. 7.

AMR devices such as the AMR device 104 are sometimes mounted remotely from the water meter 106, e.g., on a wall near the water pit 107. Alternatively, the AMR device 104 can be mounted on the water meter 106 itself, using a mounting bracket. Positioning the antenna 128 of the AMR device 104 in the optimal orientation depicted in FIG. 7 is necessary when the AMR device 104 is mounted on the wall or the water meter 106, to achieve maximum signal transmission and reception.

The AMR device 104 can be wall-mounted using a two-piece housing. A first part of the housing can be fastened to the wall. A second part of the housing, having the ARM device 104 mounted therein, can mate with the first part using suitable mating features. Alternatively, the AMR device 104 can be mounted on the water meter 106 using a housing configured to mate with an adapter ring secured to the water meter 106.

Utilizing a housing suitable for both wall mounting and mounting on the water meter 106 can present difficulties. In particular, the features used to mount the housing on a wall can potentially interfere with the features used to mate the housing with the adapter ring on the water meter 106. Moreover, housings suitable for mounting the AMR device 104 on a wall or on the water meter 106 are usually unsuitable for use with AMR devices configured for use in water pit 107 as depicted in FIG. 7.

SUMMARY OF THE INVENTION

Preferred embodiments of housings for an automatic meter reading device permit the automatic meter reading device to be mounted on a meter such as a water meter, or on a wall remote from the meter. A removable portion of the housing can be separated from a body of the housing when the housing is used to mount the automatic meter reading device on the meter.

Preferred embodiments of housings for an automatic meter reading device comprise a body defining a cavity capable of receiving the automatic meter reading device, the body having a plurality of through holes formed therein, the through holes being capable of receiving a first plurality of fasteners that secure the housing to a meter. The housings also comprise a second portion connected to the body and capable of receiving a second plurality of fasteners that secure the housings to a wall.

Preferred embodiments of housings for an automatic meter reading device comprise a body capable of receiving the automatic meter reading device, and a plurality of tabs connected to the body for supporting the body on a wall.

Preferred methods comprise placing an automatic meter reading device inside of a body of a housing, and mounting the housing on a meter, or on a wall. Mounting the housing on a wall comprises placing a second portion of the housing removably connected to the body in proximity to the wall, and fastening the second portion to the wall. Mounting the housing on a meter comprises removing the second portion of the housing from the body, placing the body in proximity to the meter, and fastening the body to the meter.

BRIEF DESCRIPTION OF THE DRAWINGS

The foregoing summary, as well as the following detailed description of a preferred embodiment, are better understood when read in conjunction with the appended diagrammatic drawings. For the purpose of illustrating the invention, the drawings show an embodiment that is presently preferred. The invention is not limited, however, to the specific instrumentalities disclosed in the drawings. In the drawings.

DETAILED DESCRIPTION OF PREFERRED EMBODIMENTS

Figure 1:
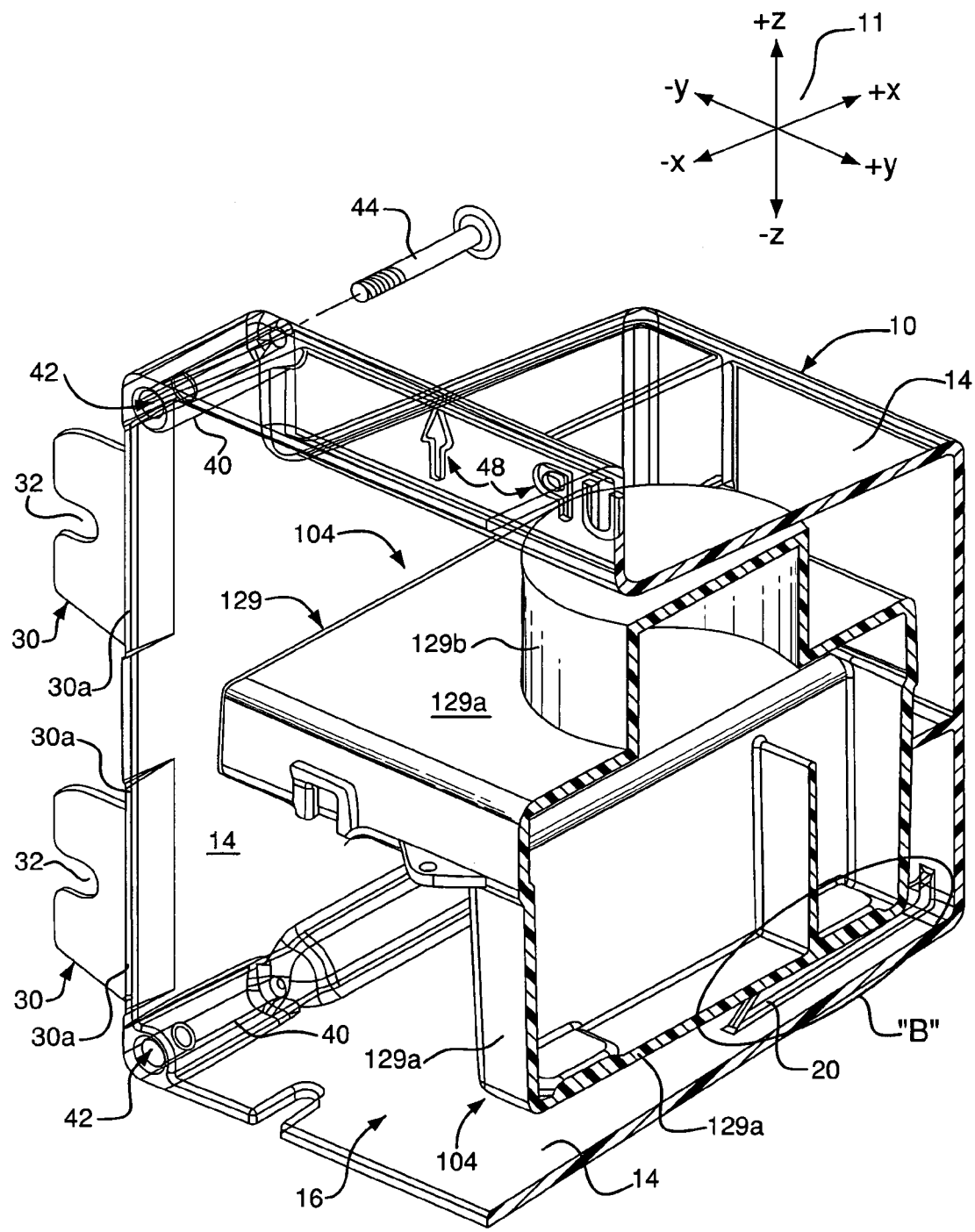
FIG. 1 is a cross-sectional perspective view of a preferred embodiment of a housing for an AMR device, taken through the line "A-A" of FIG. 2, showing the AMR device mounted within the housing, and depicting the housing as semi-transparent.
Figure 2:
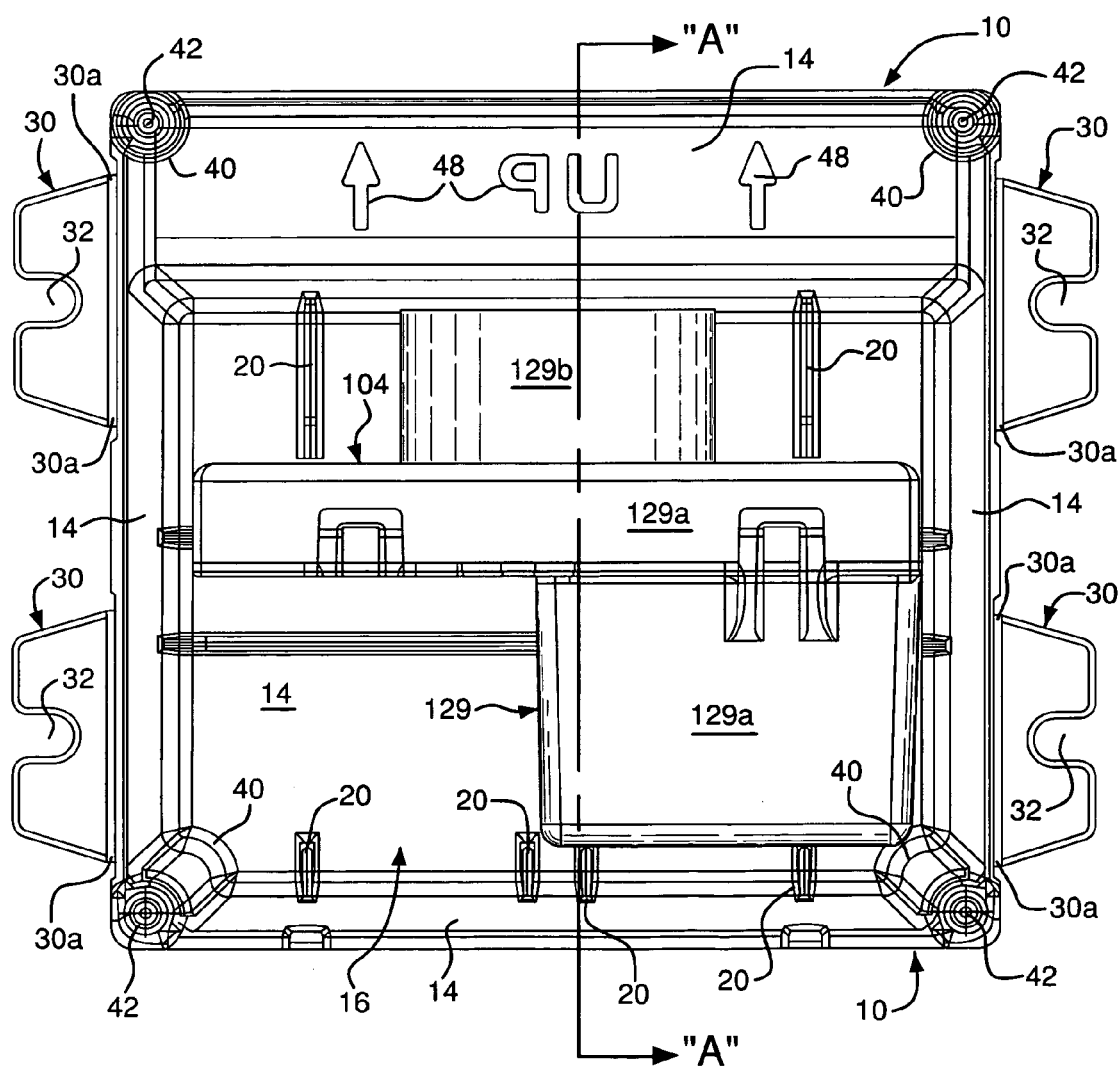
FIG. 2 is a rear view of the housing and the AMR device shown in FIG. 1.
Figure 3:
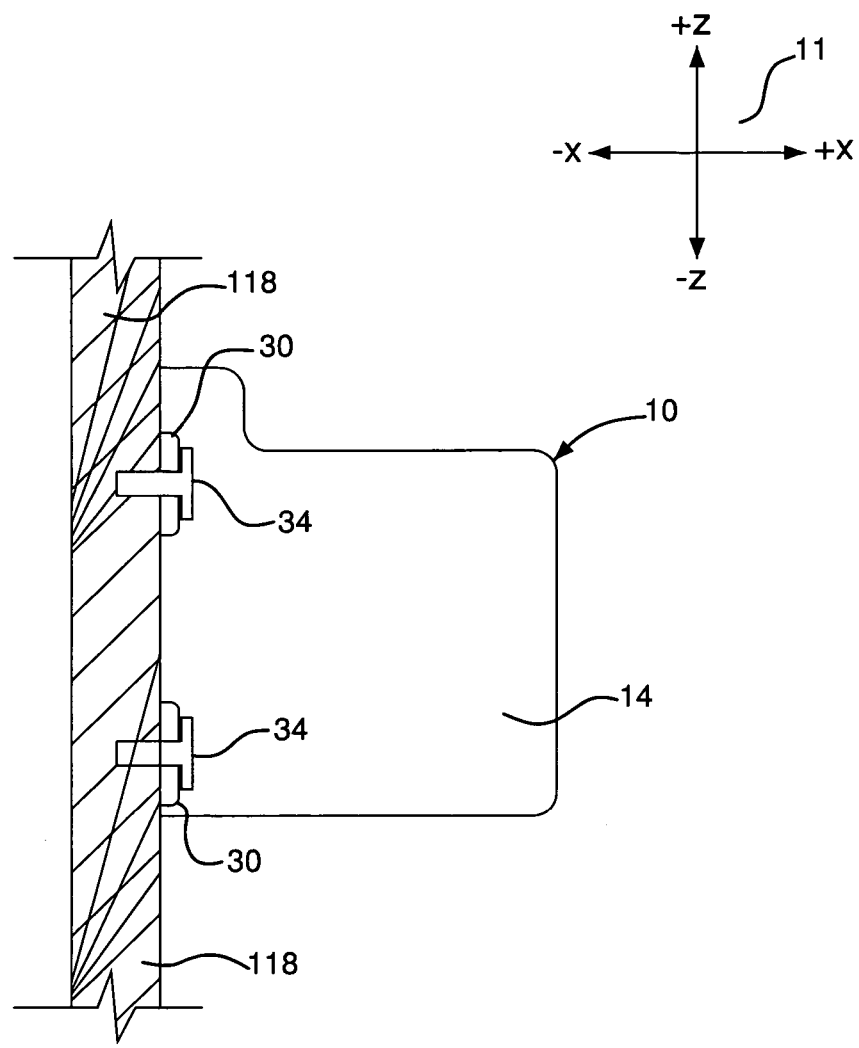
FIG. 3 is a side view depicting the housing shown in FIGS. 1 and 2 mounted on a wall.
Figure 4:
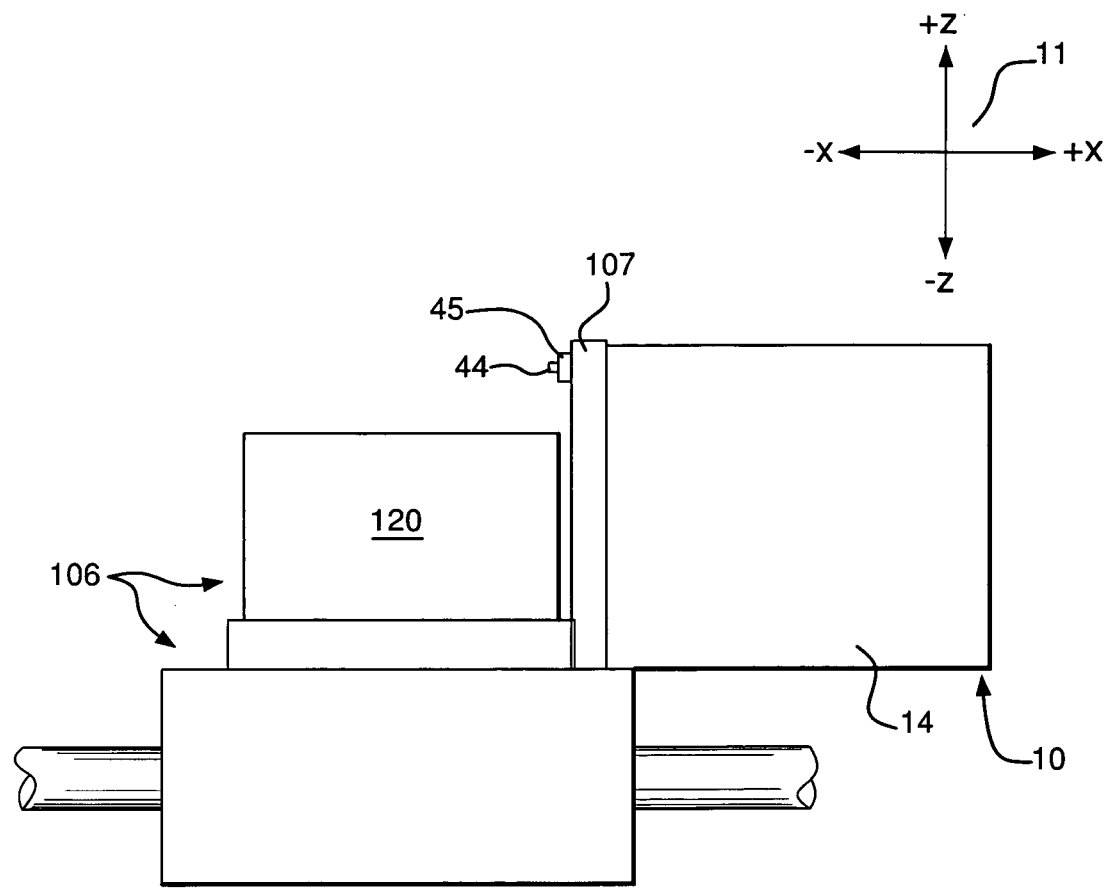
FIG. 4 is a diagrammatic side view depicting the housing shown in FIGS. 1-3 mounted on a water meter.

FIGS. 1-5 depict a preferred embodiment of a housing 10 for mounting an AMR device such as the AMR device 104. The figures are referenced to a common coordinate system 11 depicted therein. The AMR device 104 can be used to transmit information from a meter such as the water meter 106. The housing 10 facilitates mounting the AMR device 104 on a wall 118 remote from the water meter 106, as shown in FIG. 3. The housing 10 also facilitates mounting the AMR device 104 on the water meter 106, as shown in FIG. 4. The AMR device 104 can also be mounted in the water pit 107, without the housing 10, in the conventional manner depicted in FIG. 7.

The housing 10 is described in connection with a water meter for exemplary purposes only. The housing 10 can be used to mount other types of meters, such as gas meters and electricity meters. Unless otherwise noted, the term "meter," as used throughout the specification and claims, is intended to include water meters, gas meters, electricity meters, and other types of metering devices.

Figure 6:
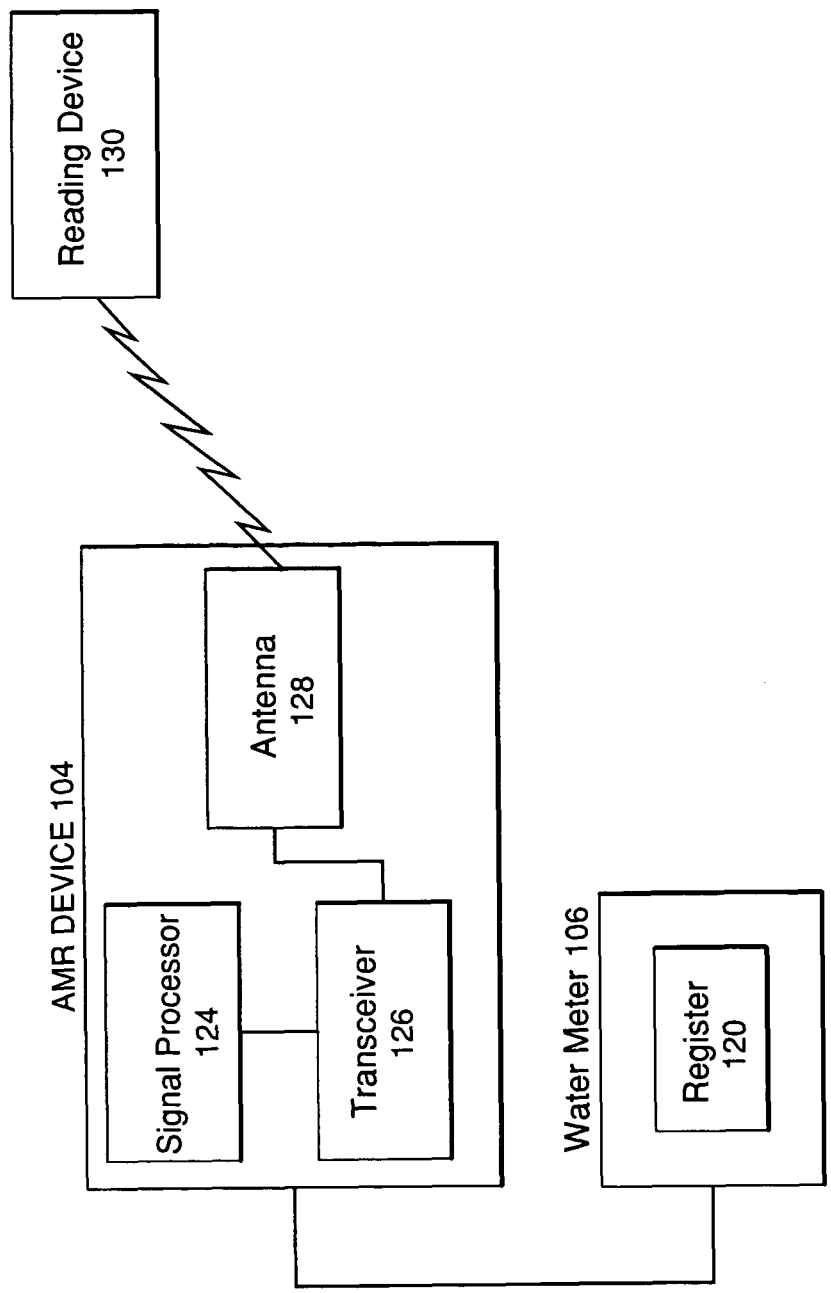
FIG. 6 is a block diagram of the AMR device and the water meter shown in FIGS. 1, 2, 4, and 5, and a reading device in communication with the AMR device.

The AMR device 104 includes a signal processor 124 communicatively coupled to an electronic register 120 of the water meter 106, as shown in FIG. 6. The signal processor 124 can be, for example, a microprocessor. The AMR device 104 also includes a transceiver 126 communicatively coupled to the signal processor 124, and an antenna 128 communicatively coupled to the transceiver 126. The signal processor 124 and the transceiver 126 are mounted in a first portion 129a of housing 129 of the AMR device 104. The antenna 128 is mounted in a second portion 129b of the housing 129. The signal processor 124, the transceiver 126, and the antenna 128 are not depicted in FIG. 1, for clarity of illustration.

The AMR device 104 reads water consumption information from the register 120 of the water meter 106. The signal processor 124 encodes the water consumption information into a digital signal. The digital signal also includes information that identifies the signal as having been generated by a particular water meter 106. The transceiver 126 transmits the digital signal to a reading device 130 via radio frequency (RF) telemetry. The reading device 130 can send an RF signal to the AMR device 104 requesting that the AMR device 104 transmit the data. Alternatively, the reading device 130 can passively listen for periodically-scheduled transmits from the AMR device 104.

The AMR device 104 can be, for example, an EnergyAxis® water module available from Elster Electricity, LLC. The water meter 106 can be any AMR-enabled water meter compatible for use with the AMR device 104.

The above details of the AMR device 104 are presented for exemplary purposes only. The housing 10, and the mounting techniques described herein, can be used in connection with other types of AMR devices.

The housing 10 is preferably formed from a non-metallic material with low RF absorption, such as polycarbonate or other plastic materials. The housing 10 can be formed by injection molding or other suitable techniques.

The housing 10 comprises a body 14. The body 14 defines an interior volume 16 that receives the AMR device 104, as shown in FIGS. 1 and 2. The interior volume 16 is sized to accommodate the entire AMR device 104, including the second portion 129b of the housing 129, which contains the antenna 128.

Figure 5:
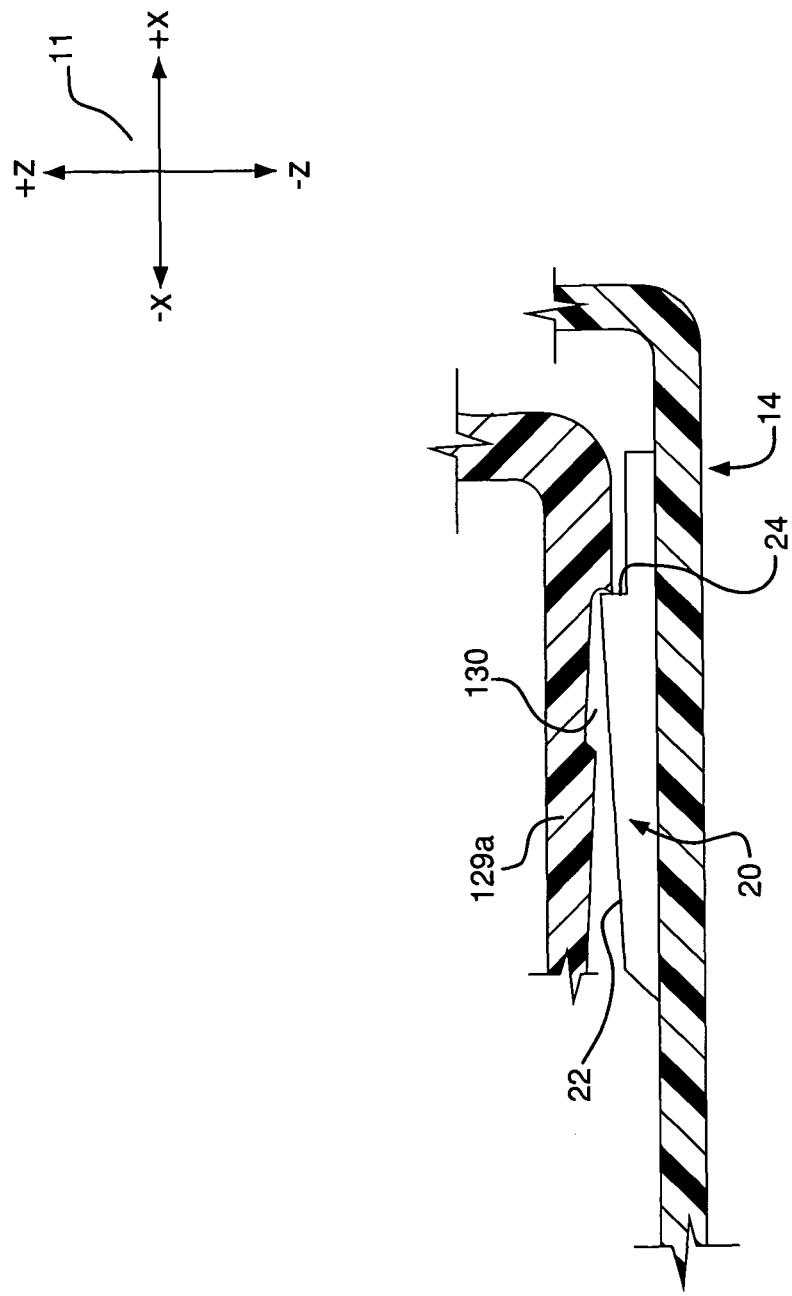
FIG. 5 is a magnified view of the area designated "B" in FIG. 1.

The housing 10 includes provisions for securing the AMR device 104 thereto. For example, the body 14 can include feet or appendages 20, as shown in FIGS. 1, 2, and 5. The appendages 20 adjoin the body 14, and project into the interior volume 16. Each appendage 20 has an edge 22 that slopes inwardly, toward the center of the interior volume 16, as the appendage 20 extends in the forward ("+x") direction, as shown in FIG. 5. Each appendage 20 includes a second edge 24 that adjoins the edge 22, and extends in the vertical ("z") direction.

The first portion 129a of the housing 129 of the AMR device 104 has dimples or recesses 130 formed therein, as shown in FIG. 5. The AMR device 104 is installed in the housing 10 by aligning each recess 130 with a corresponding appendage 20 on the body 14. The AMR device 104 can be moved forwardly, i.e., in the "+x" direction, until the edges 22 of the appendages 20 contact the body 14. The slope of the edges 22 causes the contacting surfaces of the first portion 129a of the housing 129 to ride up the projections 20 as the AMR device 104 is urged further into the interior volume 16. The resilience of the projections 20 and the first portion 129a of the housing 129 permits those components to flex as the contacting surfaces of the second portion 129a ride up the projections 20.

The forward edge of each recess 130 in the main casing 120 eventually reaches the edge 24 of a corresponding projection 20. The resilience of the projections 20 and the first portion 129a of the housing 129 causes each edge 22, and the proximal portion of the projection 20, to snap into the corresponding recess 130. Interference between the edges 24 and the edges of the recesses 130 discourage the AMR device 104 from backing out of the housing 10, as shown in FIG. 5.

Figure 7:
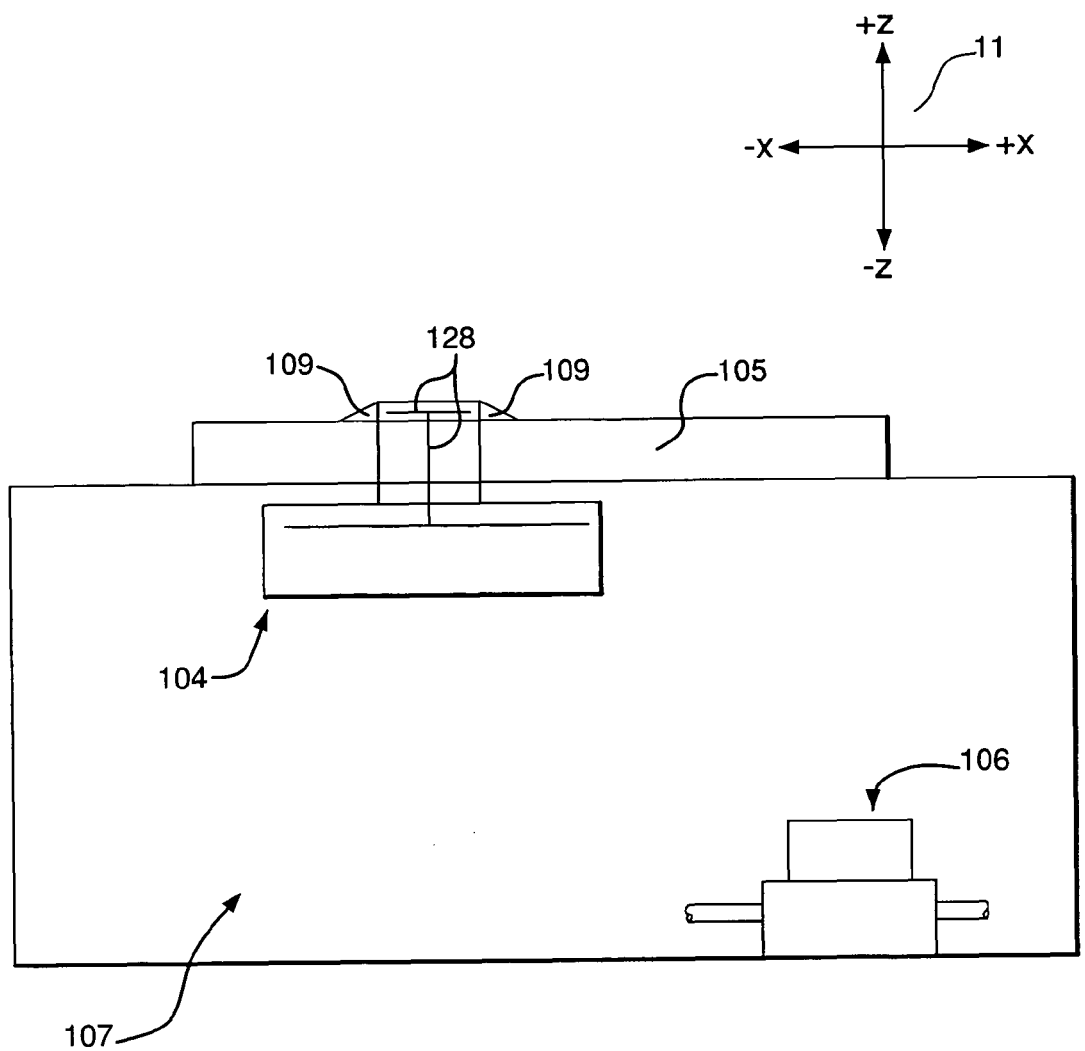
FIG. 7 is a diagrammatic side view the AMR device shown in FIGS. 1, 2, 5, and 6 mounted on a lid of a water pit in a conventional manner.

The appendages 20 are preferably configured so that the AMR device 104 can only be installed in the housing 10 in the orientation depicted in FIGS. 1 and 2. Markings 48 can be placed or formed on exterior surfaces of the housing 10, to provide the installer with a visual indication of the proper orientation of the housing 10 during installation. These features can reduce the potential for the antenna 128 of the AMR device 104 to be oriented in a manner that degrades the signal transmission and reception capabilities thereof, once the housing 10 has been installed on the wall 118 or the water meter 106. In other words, the noted features help to maximize the possibility that the antenna 128 will be oriented as depicted in FIG. 7 once the housing 10 has been installed on the wall 119 or the water meter 106.

The use of the appendages 20 to retain the AMR device 104 in the housing 10 is described for exemplary purposes only. Other restraining means, such as clamps, latches, snaps, or fasteners can be used in the alternative.

The housing 10 also includes a second portion in the form of tabs 30. The tabs 30 are connected of the body 17. Each tab 30 preferably adjoins a side edge of the body 14, as shown in FIGS. 1-3. The tabs 30 each have an open ended through hole 32 formed therein. Through holes having a circular or other type of shape can be used in alternative embodiments. The through holes 32 accept fasteners 34 that secure the housing 10 to the wall 118, as discussed below.

The second section of the housing 10 is preferably formed with features that make the second section removable from the remainder of the housing 10. For example, in embodiments in which the tabs 30 form the second part of the housing 10, the tabs 30 can be formed with a relatively thin region 30a along the desired line of separation from the body 14. This feature permits the tabs 30 to be broken off with relative ease by hand, or using suitable tooling such as pliers, when the housing 10 is used for mounting the AMR device 104 on the water meter 106.

Other means for facilitating separation of the tabs 30 from the body 14 on a selective basis can be used in the alternative. For example, a linear array of perforations along the desired line of separation can be used in lieu of the thin regions 30a.

The use of the tabs 30 as the second portion of the housing 10 is disclosed for exemplary purposes only. The second portion can have other configurations in alternative embodiments. For example, the second portion can be formed as a continuous member that extends around the entire perimeter of the body 14, or as one or more straight members that span the top, bottom, or sides of the body 14.

The body 14 can include ribs 40 that extend between the forward and rearward ends of the body 14, as shown in FIGS.

1 and 2. Each rib 40 has a passage 42 formed therein. The passages 42 each extend along the entire length ("x" dimension) of the rib 40. The passages 42 accommodate fasteners 44 that secure the housing 10 to the water meter 106, as discussed below. The housing 10 is depicted as having four of the ribs 40 for exemplary purposes only. Alternative embodiments of the housing 10 can include more, or less than four of the ribs 40. Moreover, the ribs 40 can be positioned at locations other than those depicted in the figures in alternative embodiments.

The AMR device 104 can be mounted on the wall 118 using the tabs 30 and the fasteners 34. In particular, the AMR device 104 can be inserted into the interior volume 16 and secured to the body 14 as described above. The housing 10 can then be positioned at a desired location on the wall 118. The fasteners 34 can be inserted through the through holes 32 in the tabs 30 and into the wall 118, to secure the tabs 30, the remainder of the housing 10, and the AMR device 104 to the wall 118.

Alternatively, the fasteners 34 associated with the tabs 30 on one side of the housing 10 can be partially inserted into the wall 118. The through holes 32 of the tabs 30 on one side of the housing 10 can be aligned with the partially-installed fasteners 34, and the housing 10 can be moved laterally toward the fasteners 34 so that the fasteners 34 enter the through holes 32 by way of the open ends thereof. The fasteners 34 corresponding to the tabs 30 on the other, or second side of the housing 10 can then be installed while the first side of the housing 10 is supported by the partially-installed fasteners 34. All of the fasteners 34 can then be tightened or otherwise fully inserted into the wall 118.

The fasteners 34 can be any type of fastener suitable for use with the material from which the wall 118 is fabricated. For example, the fasteners 34 can be wood screws in applications where the housing 10 is mounted on a wooden structure, or concrete anchors in applications where the housing 10 is mounted on a concrete, brick, or stone wall.

The AMR device 104 can be communicatively coupled to the water meter 106 by a suitable means such as wiring (not shown). The configuration of the appendages 20 discussed above helps to ensure that the antenna 128 of the AMR device 104 is oriented in a manner that maximizes signal transmission and reception capabilities thereof when the housing 10 is mounted on a substantially vertical wall such as the wall 118, in the orientation depicted in FIG. 3.

The AMR device 104 can be mounted on the water meter 106 using a standard adapter ring 107 secured to the water meter 106, as shown in FIG. 4. The housing 10 is sized so that the reward end of the body 14 fits within the adapter ring 107 when the tabs 30 have been removed, as shown in FIG. 4. As the tabs 30 will interfere with the mating of the body 14 and the adapter ring 107, the tabs 30 must be removed from the body 14 to configure the housing 10 for mounting on the water meter 106.

The AMR device 104 can be inserted into the interior volume 16 and secured to the body 14 as described above, before or after the tabs 30 removed. The rearward end of the body 14 can subsequently be inserted into the adapter bracket 107. The markings 48 indicate the proper orientation of the housing 10 during installation, as discussed above in connection with the wall-mounted arrangement for the housing 10.

The ribs 40 of the body 14 are positioned so that the passages 42 formed therein each align with a corresponding through hole formed in the adapter bracket 107, when the rearward end of the body 14 is inserted in the adapter bracket 107.

The fasteners 44 can subsequently be inserted into and through the passages 42 and the associated through holes in the adapter bracket 107. The ends of the fasteners 44 can have threaded ends that mate with associated nuts 45. Each nut 45, once tightened on its associated fastener 44, secures the fastener 44 to the body 14 and the adapter bracket 107.

The housing 10 thus permits an AMR device suitable for installation in a water pit to be mounted on a water meter, or on a wall remote from the water meter and the water pit. The housing 10 can be formed as a single piece, using relatively simple and inexpensive material and processes. Moreover, the housing 10 can be modified for mounting on a water meter in a relatively quick and easy manner, without the use of special tooling. Also, the housing 10 can be can be equipped with features that help to minimize the potential for the antenna 128 of the AMR device 104 to be oriented improperly after the housing 10 and the AMR device 104 are mounted.

The foregoing description is provided for the purpose of explanation and is not to be construed as limiting the invention. Although the invention has been described with reference to preferred embodiments or preferred methods, it is understood that the words which have been used herein are words of description and illustration, rather than words of limitation. Furthermore, although the invention has been described herein with reference to particular structure, methods, and embodiments, the invention is not intended to be limited to the particulars disclosed herein, as the invention extends to all structures, methods and uses that are within the scope of the appended claims. Those skilled in the relevant art, having the benefit of the teachings of this specification, may effect numerous modifications to the invention as described herein, and changes may be made without departing from the scope and spirit of the invention as defined by the appended claims.

For example, the invention can be used to adapt a standard water-meter AMR device to other devices, such as gas meters or electricity meters, that can electrically sense or read a value, in applications where it is desirable to remotely read the value.

What is claimed is:

1. A first housing for an automatic meter reading device, comprising:
   a body defining a cavity configured to receive the automatic meter reading device, the body having:
   a plurality of through holes formed therein, the through holes being configured to receive a first plurality of fasteners such that the first housing is configured to be secured to a meter when a second portion removably connected to the body is removed;
   wherein the second portion is configured to receive a second plurality of fasteners that secure the first housing to a wall, and
   wherein the body has two appendages, each of the two appendages extending from a bottom inner surface of the first housing, each of the two appendages being configured to engage with at least one recess on a second housing of the automatic meter reading device, each of the two appendages extending into the cavity and configured to restrain the automatic meter reading device within the first housing.

2. The first housing of claim 1, wherein the second portion is connected to an outer perimeter of the body.

3. The first housing of claim 1, wherein the second portion comprises a plurality of tabs.

4. The first housing of claim 3, wherein each of the tabs is configured to separate from the body along a relatively thin region of the tab proximate the body.

5. The first housing of claim 3, wherein each of the tabs has an open-ended through hole formed therein for receiving a respective one of the second plurality of fasteners.

6. The first housing of claim 1, wherein the two appendages are positioned within the body so that the automatic meter reading device can be installed in the body in only one orientation in relation to the body.

7. The first housing of claim 1, wherein the first housing has markings thereon indicating a desired orientation of the first housing to achieve maximum signal transmission and reception for the automatic meter reading device.

8. The first housing of claim 1, wherein the body further comprises a plurality of ribs each having a passage formed therein for receiving a respective one of the first plurality of fasteners.

9. The first housing of claim 1, wherein the two appendages configured to position the automatic meter reading device to maximize signal transmission and reception capabilities of the automatic meter reading device.

10. A first housing for an automatic meter reading device, the first housing comprising:
a body defining a cavity configured to receive the automatic meter reading device and having a plurality of removable tabs connected to the body for supporting the body on a wall, wherein when the removable tabs are detached from the body, the body is configured to be secured to a meter, and wherein the body has two appendages, each of the two appendages extending from a bottom inner surface of the first housing, each of the two appendages is configured to engage with at least one recess on a second housing of the automatic meter reading device, the two appendages extending into the cavity and configured to restrain the automatic meter reading device within the first housing.

11. The first housing of claim 10, wherein each of the removable tabs adjoins the body and has a relatively thin region proximate the body that facilitates removal of the tab from the body.

12. The first housing of claim 10, wherein the two appendages interferedly contact the second housing of the automatic meter reading device when the automatic meter reading device is fully inserted into the body such that the automatic meter reading device is retained in the body.

13. The first housing of claim 12, wherein the two appendages are configured to position the automatic meter reading device to maximize signal transmission and reception capabilities of the automatic meter reading device.

14. The first housing of claim 10, wherein the body has passages formed therein for receiving fasteners that secure the first housing to a meter.

15. The first housing of claim 10, wherein each of the removable tabs has a through hole formed therein for receiving a fastener that secures the first housing to the wall.

16. A method of mounting a first housing for an automatic meter reading device on a meter, or on a wall comprising:
securing the automatic meter reading device inside of a body of the first housing, the step of securing including engaging two appendages, each of the two appendages extending from a bottom inner surface of the first housing within the first housing with at least one recess on a second housing of the automatic meter reading device so as to restrain the automatic meter reading device within the first housing and either:
mounting the first housing on the wall, the step of mounting the first housing on the wall including placing a second portion of the first housing removably connected to the body in proximity to the wall, and fastening the second portion to the wall; or
mounting the first housing on the meter, the step of mounting the first housing on the meter including removing the second portion of the first housing from the body, placing the body in proximity to the meter, and fastening the body to the meter.

17. The method of claim 16, wherein fastening the body to the meter comprises fastening the body to an adapter ring of the meter.

18. The method of claim 16, wherein removing the second portion of the first housing from the body comprises separating tabs of the first housing from the body.

19. The method of claim 18, wherein separating tabs of the first housing from the body comprises breaking the tabs along a relatively thin region formed in each tab proximate the body.

20. The method of claim 16, wherein fastening the body to the meter comprises inserting fasteners through passages formed in ribs of the body.

21. The method of claim 20, wherein fastening the body to the meter further comprises inserting the fasteners through holes formed in an adapter ring connected to the meter.

22. The method of claim 21, wherein fastening the body to the meter further comprises inserting an end of the body into the adapter ring connected to the meter, and inserting the fasteners through holes formed in the adapter ring.

23. The method of claim 16, wherein fastening the second portion to the wall comprises inserting fasteners through tabs connected to the body.

24. The method of claim 16, wherein the step of securing further includes positioning the automatic meter reading device to maximize signal transmission and reception capabilities of the automatic meter reading device.

* * * * *